(12) United States Patent
Annen et al.

(10) Patent No.: US 10,697,068 B2
(45) Date of Patent: Jun. 30, 2020

(54) CONTOUR-FOLLOWING PROTECTIVE LAYER FOR COMPRESSOR COMPONENTS OF GAS TURBINES

(71) Applicants: SIEMENS AKTIENGESELLSCHAFT, München (DE); OERLIKON SURFACE SOLUTIONS AG, PFÄFFIKON, Pfäffikon (CH)

(72) Inventors: Michael Annen, Duisburg (DE); Jochen Barnikel, Mülheim an der Ruhr (DE); Arturo Flores Renteria, Berlin (DE); Andrei Ghicov, Erlangen (DE); Sascha Hessel, Warmsroth (DE); Torsten Neddemeyer, Falkensee (DE); Jürgen Ramm, Maienfeld (CH)

(73) Assignees: SIEMENS AKTIENGESELLSCHAFT, München (DE); OERLIKON SURFACE SOLUTIONS AG, PFÄFFIKON, Pfäffikon (SE)

( * ) Notice: Subject to any disclaimer, the term of this patent is extended or adjusted under 35 U.S.C. 154(b) by 2 days.

(21) Appl. No.: 15/741,298

(22) PCT Filed: Jun. 14, 2016

(86) PCT No.: PCT/EP2016/063557
§ 371 (c)(1),
(2) Date: Jan. 2, 2018

(87) PCT Pub. No.: WO2017/005460
PCT Pub. Date: Jan. 12, 2017

(65) Prior Publication Data
US 2018/0195176 A1    Jul. 12, 2018

(30) Foreign Application Priority Data

Jul. 6, 2015  (DE) .................. 10 2015 212 588

(51) Int. Cl.
*C23C 14/34* (2006.01)
*C23C 28/00* (2006.01)
(Continued)

(52) U.S. Cl.
CPC ........ *C23C 28/321* (2013.01); *C23C 14/0641* (2013.01); *C23C 14/081* (2013.01);
(Continued)

(58) Field of Classification Search
CPC . C23C 28/321; C23C 14/0641; C23C 14/081; C23C 14/083; C23C 14/165;
(Continued)

(56) References Cited

U.S. PATENT DOCUMENTS

| 4,873,152 A | 10/1989 | Garg et al. |
| 5,714,202 A | 2/1998 | Conley |

(Continued)

FOREIGN PATENT DOCUMENTS

| CN | 102744930 A | 10/2012 |
| CN | 103966539 A | 8/2014 |

(Continued)

OTHER PUBLICATIONS

Russian Search Report for Application No. 2018104268/02(006361).

(Continued)

*Primary Examiner* — Jonathan C Langman
(74) *Attorney, Agent, or Firm* — Schmeiser, Olsen & Watts LLP

(57) ABSTRACT

Provided is a coating system for a substrate, the system including a first, second and third layer. In the system, the first layer is designed as an adhesion promoter layer, the second layer is a ductile metal layer with a columnar structure and the uppermost, third layer is a ceramic oxide layer with a high hardness value. The substrate is ideally an (Continued)

element of a compressor component of a stationary gas turbine. Also disclosed is a method for producing the coating system.

12 Claims, 2 Drawing Sheets

(51) Int. Cl.
*F01D 5/28* (2006.01)
*C23C 14/06* (2006.01)
*C23C 14/08* (2006.01)
*C23C 14/16* (2006.01)
*F04D 29/02* (2006.01)
*F04D 29/32* (2006.01)
*F04D 29/38* (2006.01)

(52) U.S. Cl.
CPC .......... *C23C 14/083* (2013.01); *C23C 14/165* (2013.01); *C23C 28/322* (2013.01); *C23C 28/3215* (2013.01); *C23C 28/34* (2013.01); *C23C 28/345* (2013.01); *C23C 28/3455* (2013.01); *F01D 5/286* (2013.01); *F01D 5/288* (2013.01); *F04D 29/023* (2013.01); *F04D 29/324* (2013.01); *F04D 29/388* (2013.01); *C23C 14/34* (2013.01); *F05D 2230/311* (2013.01); *F05D 2230/313* (2013.01)

(58) Field of Classification Search
CPC ... C23C 28/3215; C23C 28/322; C23C 28/34; C23C 28/345; C23C 28/3455; C23C 14/34; F01D 5/286; F01D 5/288; F04D 29/023; F04D 29/324; F04D 29/388; F05D 2230/311; F05D 2230/313
See application file for complete search history.

(56) References Cited

U.S. PATENT DOCUMENTS

| | | | |
|---|---|---|---|
| 2006/0018760 A1* | 1/2006 | Bruce | C23C 30/00 416/229 A |
| 2008/0317998 A1* | 12/2008 | Eichmann | C23C 14/226 428/105 |
| 2009/0075115 A1 | 3/2009 | Tryon et al. | |
| 2009/0252973 A1 | 10/2009 | Cremer | |
| 2009/0297720 A1* | 12/2009 | Ramgopal | C23C 4/06 427/455 |
| 2010/0047063 A1 | 2/2010 | Kulkarni et al. | |
| 2011/0299996 A1 | 12/2011 | Uihlein et al. | |
| 2013/0209834 A1 | 8/2013 | Engelhart et al. | |

FOREIGN PATENT DOCUMENTS

| | | |
|---|---|---|
| DE | 102009010110 A1 | 9/2010 |
| DE | 102010028558 A1 | 11/2011 |
| EP | 2754733 A1 | 7/2014 |
| RU | 2228387 C2 | 5/2004 |
| RU | 2413791 C2 | 3/2011 |
| WO | WO 2010012701 A1 | 2/2010 |
| WO | WO 2010094256 A1 | 8/2010 |

OTHER PUBLICATIONS

Russian Office Action dated Nov. 2, 2018 for Application No. 2018104268/02(006361).
PCT International Search Report and Written Opinion of International Searching Authority dated Sep. 20, 2016 corresponding to PCT International Application No. PCT/EP2016/063557 filed Jun. 14, 2016.
Non-English Chinese Office Action dated Feb. 3, 2019 for Application No. 201680039641.5.

* cited by examiner

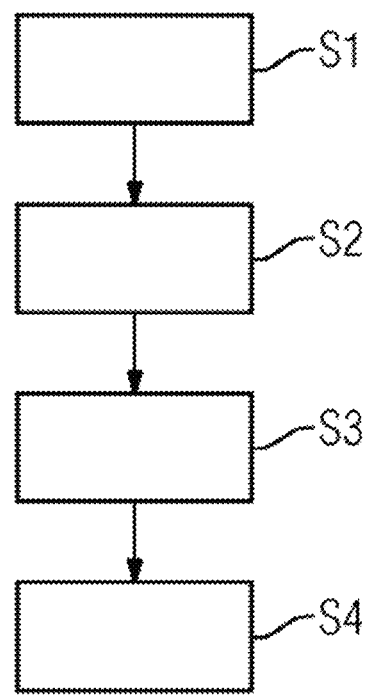

CONTOUR-FOLLOWING PROTECTIVE LAYER FOR COMPRESSOR COMPONENTS OF GAS TURBINES

CROSS-REFERENCE TO RELATED APPLICATIONS

This application claims priority to PCT Application No. PCT/EP2016/063557, having a filing date of Jun. 14, 2016, based on German Application No. 10 2015 212 588.2, having a filing date of Jul. 6, 2015, the entire contents both of which are hereby incorporated by reference.

FIELD OF TECHNOLOGY

The following relates to a multi-layered coating system for a corrosively loaded substrate.

BACKGROUND

Components of gas turbines are exposed to a corrosion medium. Coatings are applied to protect these components from corrosion. Thus, a high-temperature lacquer containing aluminum particles is used for compressor components of gas turbines, particularly of stationary gas turbines. However, coatings of this type have a low integral hardness (approximately 50 HV). As a result, the erosion resistance (e.g. to particle erosion or drop impingement erosion) is also relatively low. The low integral hardness can be attributed above all to the soft aluminum particles in the coating. Owing to the low erosion resistance, it is necessary after specific time intervals for the components to be examined for erosion, and, if necessary, decoated, tested and recoated with the same coating. This procedure is time-consuming and labor-intensive. It is therefore the object to improve the erosion resistance of components of gas turbines.

SUMMARY

An aspect relates to a coating system for a corrosively loaded substrate having a surface, said coating system at least comprising a first layer, a second layer and a third layer, in which
  the first layer, which is arranged between the surface of the substrate and the second layer, is designed as an adhesion promoter layer,
  the second layer is a ductile metallic layer having a columnar structure, and
  the third layer, which is arranged on that side of the second layer which faces away from the substrate, is a ceramic oxide layer having a hardness of at least 20 GPa.

The coating system according to embodiments of the invention is advantageous because, compared to conventional coatings, it requires less maintenance, and the maintenance and repair intervals can be selected more generously. As a result, the system is economically more effective, since lower costs and less time have to be expended to maintain it. In addition to an increased erosion resistance, the coating according to embodiments of the invention has at least similar corrosion fatigue cracking properties to a high-temperature lacquer containing aluminum particles.

The indication of hardness in the unit GPa refers to the pressure which the coating can provide counter to the penetration of an object.

The formation of the first layer as an adhesion promoter layer ensures higher adhesion between the base material and the second layer of the coating system. The first layer of the coating system preferably comprises chromium or chromium nitride.

The second layer protects the substrate advantageously cathodically through its function as a sacrificial anode. The ductility of the second layer advantageously serves for resisting instances of elongation upon vibrational loading, without cracks arising in the layer. The columnar structure of the second layer advantageously serves for compensating for residual stresses caused by the third layer. The columnar structure of the second layer preferably consists of an aluminum-containing alloy, e.g. an alloy comprising aluminum and chromium.

The third layer of the coating system according to embodiments of the invention preferably comprises aluminum oxide and/or chromium oxide and/or an aluminum/chromium oxide in a solid solution structure. It can also consist entirely of these oxides. By virtue of the oxides, the third layer is resistant to oxidation, since it already consists of at least one oxide and therefore can be used at high temperatures. The third layer has a very dense structure. The third layer acts, inter alia, advantageously as corrosion protection for the second layer. Furthermore, the third layer has an insulating action on account of its ceramic nature, as a result of which galvanic effects are advantageously prevented. Furthermore, the third layer is significantly harder than the base material and therefore advantageously acts as protection against erosion, particularly against drop impingement erosion and particle erosion, for the underlying layers and the base material. The hardness of the third layer is preferably approximately 25 GPa.

The substrate on which the three layers are applied is preferably a constituent part of a compressor component of a gas turbine. It is particularly preferable for the substrate to be a constituent part of a compressor component of a stationary gas turbine. By way of example, the compressor component may be a compressor blade.

A second aspect of embodiments of the invention relates to a compressor component of a gas turbine having a coating system according to embodiments of the invention. In other words, the compressor component according to embodiments of the invention of a gas turbine comprises a coating system for a corrosively loaded substrate having a surface, said coating system at least comprising a first layer, a second layer and a third layer, in which the first layer, which is arranged between the surface of the substrate and the second layer, is designed as an adhesion promoter layer, the second layer is a ductile metallic layer having a columnar structure, and the third layer, which is arranged on that side of the second layer which faces away from the substrate, is a ceramic oxide layer having a hardness of at least 20 GPa. The gas turbine in this case is preferably a stationary gas turbine.

A third aspect of embodiments of the invention relates to a method for producing a coating system for a corrosively loaded substrate, comprising three layers corresponding to the coating system according to embodiments of the invention, wherein the material of all of the layers is applied by physical vapor deposition (PVD). The method is advantageous because a heat treatment which has to be carried out during the application of conventional layers is not required. Furthermore, layers applied by PVD have an advantageous surface roughness, which brings about good aerodynamic properties. Furthermore, the PVD method is advantageous for coating because the thickness of the layer can be up to 10 μm, and therefore coated components can be reproduced with accurate contours, i.e. no additional maskings are necessary.

The layers of the coating system are preferably applied by cathodic arc evaporation and/or by sputtering. In other words, the layers can be applied by one of the aforementioned methods or by a combination of both methods.

BRIEF DESCRIPTION

Some of the embodiments will be described in detail, with references to the following figures, wherein like designations denote like members, wherein:

FIG. 3 shows a flowchart of an embodiment of the method according to embodiments of the invention.

DETAILED DESCRIPTION

Figure 1:
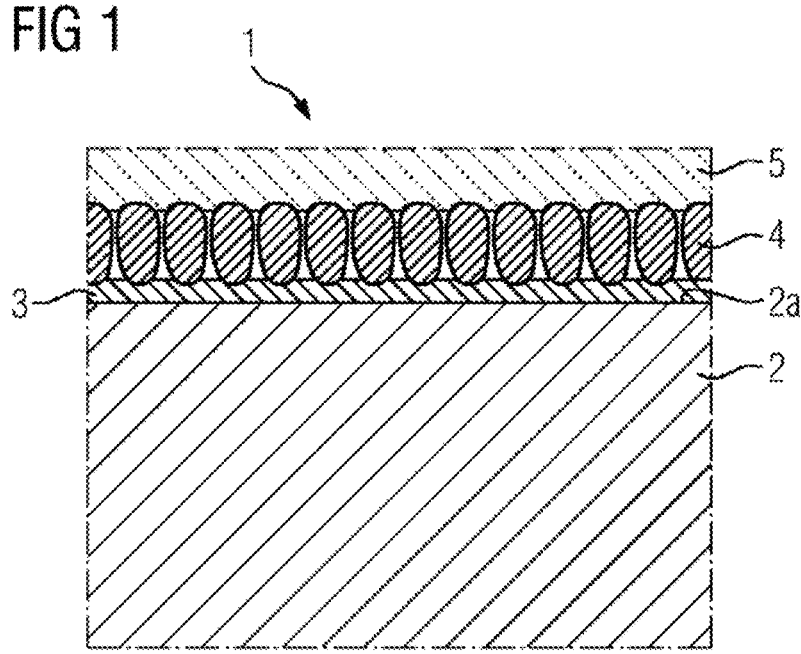
FIG. 1 shows an embodiment of a coating system.

In the embodiment shown in FIG. 1, the coating system 1 has a substrate 2 having a surface 2a, a first layer 3, a second layer 4 and a third layer 5. The substrate 2 comprises at least one metal and may be a metal alloy. Under corrosive conditions, the substrate 2 may be susceptible to corrosion.

The first layer 3 is arranged on the surface 2a and has a thickness of approximately 100 nm. It preferably consists of chromium or chromium nitride, but in its property as an adhesion promoter layer it can also comprise other metals or have a different composition, e.g. of the type MCrAlY.

The second layer 4 is arranged on the first layer 3 and has a thickness in the range of 0.5-5.0 μm, preferably of 1.0-3.0 μm. The second layer 4 is a ductile metallic layer having a columnar structure consisting of an aluminum alloy. By way of example, the second layer 4 consists of an alloy comprising aluminum and chromium; alternatively, however, the alloy can also contain further metals or metals other than chromium.

The third layer 5 is arranged on the second layer 4 and has a thickness in the range of 0.5-10.0 μm, preferably of 1.0-5.0 μm. The third layer 5 is a hard ceramic oxide layer having a very dense structure. The material of the third layer 5 is a mixture of chromium oxide and aluminum oxide, preferably of a solid solution compound of aluminum/chromium oxide and additional Al—Cr intermetallic compounds. Further oxides and other compounds or elements can also be present in the third layer 5. The third layer 5 is resistant to corrosion since it already consists of oxides. As a result, the third layer 5 protects the substrate 2 and the other layers against corrosion. The ceramic constituents give the third layer 5 a high hardness, which is typically up to 25 GPa. The third layer 5 is therefore considerably harder than the substrate 2 and the other layers. The high hardness becomes effective against erosion, particularly against drop impingement erosion and particle erosion.

Figure 2:
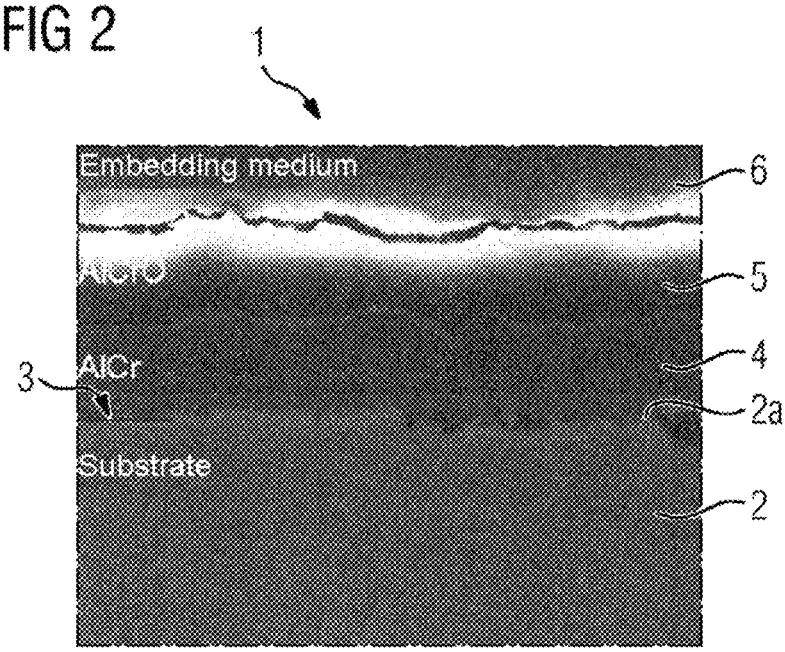
FIG. 2 shows an electron microscopy image of the embodiment as shown in FIG. 1.

The thickness of the coating system in total may be up to 20 μm. In this case, the individual layers, particularly the second layer 4 and the third layer 5, may also have a higher thickness than that indicated above. The embedding compound 6 shown in FIG. 2 is applied to the third layer 5 for metallographic investigations. The embedding layer comprises inorganic oxides. FIG. 2 is a representation of a scanning electron microscopy image of a coating system 1, in which the first layer 3 is barely visible owing to its small thickness.

The substrate 2 preferably belongs to a compressor component, preferably to a compressor blade of a stationary gas turbine. However, it may also belong to another component of a stationary gas turbine or of another gas turbine.

For producing the coating system 1 described, in one embodiment of the method as per the illustration of FIG. 3, a substrate 2 having a surface 2a is provided in a first step S1. In a second step S2, the material of the first layer 3 is applied by physical vapor deposition (PVD). In a third step S3, the material of the second layer 4 is applied likewise by PVD. In a fourth step S4, the material of the third layer 5 is applied likewise by PVD.

In this case, cathodic arc evaporation is carried out as the preferred method of the PVD. A method which is likewise preferred is sputtering. It is likewise preferable if the two methods are combined with one another. Further possible usable methods, which can be used alternatively and/or in combination with the aforementioned methods, are thermal evaporation, electron beam evaporation, laser beam evaporation or arc evaporation.

Although the invention has been illustrated and described in greater detail with reference to the preferred exemplary embodiment, the invention is not limited to the examples disclosed, and further variations can be inferred by a person skilled in the art, without departing from the scope of protection of the invention.

For the sake of clarity, it is to be understood that the use of "a" or "an" throughout this application does not exclude a plurality, and "comprising" does not exclude other steps or elements.

The invention claimed is:

1. A coating system comprising:
a corrosively loaded substrate of a base material of a gas turbine compressor component, the corrosively loaded substrate including a surface; and
at least a first layer, a second layer and a third layer, in which
the first layer, which is arranged between the surface and the second layer such that the first layer is in direct contact with the surface, is designed as a single layer adhesion promoter between the corrosively loaded substrate and the second layer, the first layer comprising chromium or chromium nitride,
the second layer, in direct contact with the first layer, is an aluminum alloy ductile metallic layer having a columnar structure, and
the third layer, which is arranged on that side of the second layer which faces away from the corrosively loaded substrate is a ceramic oxide layer having a hardness of at least 20 GPa.

2. The coating system as claimed in claim 1, in which the third layer comprises aluminum oxide and/or chromium oxide and/or an aluminum/chromium oxide in a solid solution structure.

3. The coating system as claimed in claim 1, in which the hardness of the third layer is approximately 25 GPa.

4. The coating system as claimed in claim 1, wherein the gas turbine is a stationary gas turbine.

5. The coating system of claim 1, wherein the second layer is configured to protect the corrosively loaded substrate by acting as a sacrificial anode.

6. A method for producing the coating system as claimed in claim 1, wherein the materials of the first layer, second layer, and third layer are applied by physical vapor deposition.

7. The method as claimed in claim 6, wherein the materials of the first layer, second layer, and third layer are applied by cathodic arc evaporation and/or by sputtering.

8. A coating system for a corrosively loaded substrate having a surface, said coating system at least comprising a first layer, a second layer and a third layer, in which
   the first layer, which is arranged directly between the surface of the substrate and the second layer, is designed as a single layer adhesion promoter layer comprising chromium or chromium nitride,
   the second layer is an aluminum alloy ductile metallic layer having a columnar structure, wherein the second layer is configured to protect the corrosively loaded substrate by acting as a sacrificial anode to the corrosively loaded substrate, and
   the third layer, which is arranged on that side of the second layer which faces away from the substrate, is a ceramic oxide layer having a hardness of at least 20 GPa.

9. The coating system of claim 8, wherein the third layer is configured to protect the second layer from corrosion.

10. The coating system of claim 8, wherein the third layer is made of a solid solution compound of aluminum oxide and chromium oxide and additional aluminum and chromium intermetallic compounds.

11. The coating system of claim 8, wherein the first layer has a thickness of approximately 100 nm, wherein the second layer has a second thickness of between approximately 0.5 μm and 5.0 μm, and wherein the third layer has a third thickness of between approximately 0.5 μm and 10.0 μm.

12. A compressor component of a gas turbine, the compressor component having a base material, a corrosively loaded substrate of the base material including a surface, and a coating system including a first layer, a second layer and a third layer, in which
   the first layer, which is arranged between the surface and the second layer such that the first layer is in direct contact with the surface, is designed as a single layer adhesion promoter between the corrosively loaded substrate and the second layer, the first layer comprising chromium or chromium nitride,
   the second layer, in direct contact with the first layer, is an aluminum ductile metallic layer having a columnar structure, and
   the third layer, which is arranged on that side of the second layer which faces away from the corrosively loaded substrate is a ceramic oxide layer having a hardness of at least 20 GPa.

\* \* \* \* \*